United States Patent
Park et al.

(10) Patent No.: US 9,005,774 B2
(45) Date of Patent: Apr. 14, 2015

(54) ORGANIC LIGHT EMITTING DIODE DEVICE

(75) Inventors: Mie-Hwa Park, Yongin (KR); Tae-Shick Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 475 days.

(21) Appl. No.: 13/215,102

(22) Filed: Aug. 22, 2011

(65) Prior Publication Data

US 2012/0292605 A1    Nov. 22, 2012

(30) Foreign Application Priority Data

May 17, 2011    (KR) .................. 10-2011-0046472

(51) Int. Cl.
H01L 51/54    (2006.01)
H01L 51/50    (2006.01)
H01L 51/00    (2006.01)

(52) U.S. Cl.
CPC ........ H01L 51/5076 (2013.01); H01L 51/0054 (2013.01); *Y10S 428/917* (2013.01)

(58) Field of Classification Search
CPC . H01L 51/5076; H01L 51/0054; C09K 11/06
See application file for complete search history.

(56) References Cited

U.S. PATENT DOCUMENTS

| | | | | |
|---|---|---|---|---|
| 6,396,209 B1* | 5/2002 | Kido et al. | ..................... | 313/504 |
| 8,212,244 B2* | 7/2012 | Park et al. | ..................... | 257/40 |
| 2004/0207318 A1* | 10/2004 | Lee et al. | ..................... | 313/506 |
| 2005/0238910 A1 | 10/2005 | Ionkin et al. | | |
| 2007/0020483 A1* | 1/2007 | Park et al. | ..................... | 428/690 |
| 2007/0020484 A1* | 1/2007 | Kim et al. | ..................... | 428/690 |
| 2007/0048545 A1* | 3/2007 | Hatwar et al. | ................. | 428/690 |
| 2007/0167626 A1* | 7/2007 | Kim et al. | ..................... | 546/1 |
| 2008/0193796 A1* | 8/2008 | Arakane et al. | ............... | 428/690 |
| 2009/0206736 A1* | 8/2009 | Kuma et al. | .................... | 313/504 |
| 2010/0244665 A1 | 9/2010 | Herron et al. | | |
| 2012/0001161 A1* | 1/2012 | Nakano et al. | .................. | 257/40 |

FOREIGN PATENT DOCUMENTS

| | | |
|---|---|---|
| EP | 1 808 912 A2 | 7/2007 |
| JP | 2007-191603 A | 8/2007 |
| KR | 10-2000-0048161 A | 7/2000 |
| KR | 10-2007-0003586 A | 1/2007 |
| KR | 10-2007-0013002 A | 1/2007 |
| KR | 10-0698300 B1 | 3/2007 |
| WO | WO 2010/113743 * | 10/2010 |

OTHER PUBLICATIONS

Extended European Search Report dated Aug. 12, 2012 for European Patent Application No. EP 12 161 757.5 which shares priority of Korean Patent Application No. KR 10-2011-0046472 with captioned U.S. Appl. No. 13/215,102.

\* cited by examiner

*Primary Examiner* — Dawn L. Garrett
(74) *Attorney, Agent, or Firm* — Knobbe Martens Olson & Bear, LLP

(57) ABSTRACT

In one aspect, an organic light emitting diode device that includes a first electrode, a second electrode facing the first electrode, an emission layer interposed between the first electrode and the second electrode and an auxiliary layer interposed between either one of the first electrode and the second electrode and the emission layer, wherein the auxiliary layer includes a substituted or unsubstituted pyrene-based compound having at least one appended phenyl group is provided.

4 Claims, 2 Drawing Sheets

ORGANIC LIGHT EMITTING DIODE DEVICE

CROSS-REFERENCE TO RELATED APPLICATIONS

This application claims priority to and the benefit of Korean Patent Application No. 10-2011-0046472 filed in the Korean Intellectual Property Office on May 17, 2011, the entire contents of which are incorporated herein by reference.

BACKGROUND

1. Field

This disclosure relates to an organic light emitting diode device.

2. Description of the Related Technology

Recently, an organic light emitting diode (OLED) device has been finding utility as a display device and a luminous device.

An organic light emitting diode device includes two electrodes and an emission layer interposed therebetween, and emits light when electrons injected from one electrode are combined with holes injected from another electrode in an emission layer to generate excitons that release energy.

Since the organic light emitting diode device emits light without a particular light source, it has excellent response speed, viewing angle, and contrast ratio as well as low power consumption.

An organic light emitting diode device has been preferred to have increased luminous efficiency and life-span.

SUMMARY

Some embodiments provide, an organic light emitting diode device having an excellent luminous efficiency and life-span characteristics.

According to one embodiment, an organic light emitting diode device is provided that includes a first electrode; a second electrode facing the first electrode; an emission layer interposed between the first electrode and the second electrode; and an auxiliary layer interposed between either one of the first electrode and the second electrode and the emission layer, wherein the auxiliary layer includes a substituted or unsubstituted pyrene-based compound including at least one appended phenyl group.

In some embodiments, the pyrene-based compound may include a compound represented by the following Chemical Formula 1.

[Chemical Formula 1]

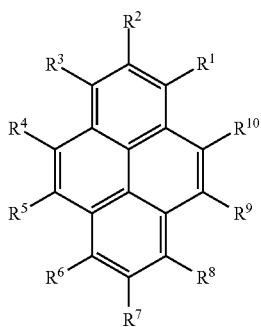

wherein, $R^1$, $R^2$, $R^3$, $R^4$, $R^5$, $R^6$, $R^7$, $R^8$, $R^9$, and $R^{10}$ can each separately be hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C30 cycloalkyl group, a substituted or unsubstituted C3 to C30 cycloalkenyl group, a substituted or unsubstituted C3 to C30 cycloalkynyl group, a substituted or unsubstituted C6 to C30 aryl group, a substituted or unsubstituted C6 to C30 aryl amine group, a substituted or unsubstituted C1 to C30 heterocycloalkyl group, a substituted or unsubstituted C1 to C30 heterocycloalkenyl group, a substituted or unsubstituted C1 to C30 heterocycloalkynyl group, a substituted or unsubstituted C3 to C30 heteroaryl group, a substituted or unsubstituted silane group, a substituted or unsubstituted boron atom, an amine group, a nitrile group, a nitro group, a halogen, an amide group, an ester group, a sulfonyl group, a sulfoxide group, a sulfonamide group, a sulfonate group, or a trifluoromethyl group, or one or more of the forgoing groups optionally forms a condensed cyclic group with an adjacent group, and at least one of $R^1$, $R^2$, $R^3$, $R^4$, $R^5$, $R^6$, $R^7$, $R^8$, $R^9$, and $R^{10}$ can be a phenyl group.

In some embodiments, at least one of $R^1$, $R^2$, $R^3$, $R^4$, $R^5$, $R^6$, $R^7$, $R^8$, $R^9$, and $R^{10}$ in above Chemical Formula 1 may be a phenyl group, and at least one thereof may be a benzofuran group, dibenzofuran group, carbazole group, naphthyl group, pyridine group, quinoline group, isoquinoline group, benzimidazole group, phenanthroline group, acridine group, imidazole group, triazole group, bipyridine group, or benzoxazole group. In some embodiments, $R^1$ may be a phenyl group and at least one of $R^2$, $R^3$, $R^4$, $R^5$, $R^6$, $R^7$, $R^8$, $R^9$, and $R^{10}$ may be a benzofuran group, dibenzofuran group, carbazole group, naphthyl group, pyridine group, quinoline group, isoquinoline group, benzimidazole group, phenanthroline group, acridine group, imidazole group, triazole group, bipyridine group, or benzoxazole group. In some embodiments, $R^2$ may be a phenyl group and at least one of $R^1$, $R^3$, $R^4$, $R^5$, $R^6$, $R^7$, $R^8$, $R^9$, and $R^{10}$ may be a benzofuran group, dibenzofuran group, carbazole group, naphthyl group, pyridine group, quinoline group, isoquinoline group, benzimidazole group, phenanthroline group, acridine group, imidazole group, triazole group, bipyridine group, or benzoxazole group. In some embodiments, $R^4$ may be a phenyl group and at least one of $R^1$, $R^2$, $R^3$, $R^5$, $R^6$, $R^7$, $R^8$, $R^9$, and $R^{10}$ may be a benzofuran group, dibenzofuran group, carbazole group, naphthyl group, pyridine group, quinoline group, isoquinoline group, benzimidazole group, phenanthroline group, acridine group, imidazole group, triazole group, bipyridine group, or benzoxazole group.

In some embodiments, the auxiliary layer may further include an inorganic compound or a metal.

In some embodiments, the inorganic compound may include a Liq compound represented by the following Chemical Formula 2, LiF, NaF, KF, RbF, CsF, FrF, $MgF_2$, $CaF_2$, $SrF_2$, BaF, LiCl, NaCl, KCl, RbCl, CsCl, FrCl, $Li_2O$, $Li_2O_2$, $Na_2O$, $K_2O$, RbO, $Rb_2O_2$, $Cs_2O$, $Cs_2O_2$, $LiAlO_2$, $LiBO_2$, $LiTaO_3$, $LiNbO_3$, $LiWO_4$, $Li_2CO$, $NaWO_4$, $K_2SiO_3$, BO, $Al_2O_3$, $SiO_2$ or combination thereof, and the metal may include Li, Na, K, Cs, Be, Mg, Ca, Sr, Ba, Y, La, Ce, Sm, Gd, Eb, Yb, Al—Li alloy, a Mg—Sr alloy, In—Li alloy, or a combination thereof

[Chemical Formula 2]

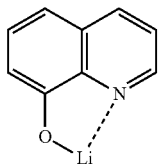

In some embodiments, the substituted or unsubstituted pyrene-based compound including at least one phenyl group and the inorganic compound or metal may be mixed in a weight ratio of 1:100 to 100:1, for example, a weight ratio of 1:1 to 1:2.

In some embodiments, the auxiliary layer may include an electron transport layer (ETL).

The organic light emitting diode device may have excellent luminous efficiency and life-span characteristic.

DETAILED DESCRIPTION

Figure 1:
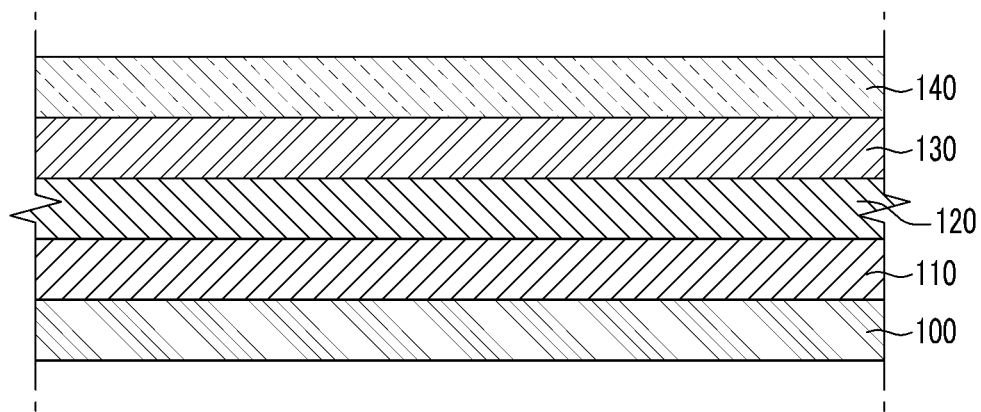
FIG. 1 is the schematic cross-sectional view of an organic light emitting diode device according to one embodiment.

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a specific definition is otherwise provided, the term "amine group" refers to NRR' (wherein R and R' are the same or different and are hydrogen, a substituted or unsubstituted C1 to C20 alkyl group, a substituted or unsubstituted C1 to C20 alkoxy group, a substituted or unsubstituted C6 to C30 aryl group, or a substituted or unsubstituted C6 to C30 aryloxy group.

As used herein, the term "amide group" refers to CONRR' (wherein R and R' are the same or different and are hydrogen, a substituted or unsubstituted C1 to C20 alkyl group, a substituted or unsubstituted C1 to C20 alkoxy group, a substituted or unsubstituted C6 to C30 aryl group, or a substituted or unsubstituted C6 to C30 aryloxy group).

As used herein, the term "ester group" refers to COOR (wherein R is hydrogen, a substituted or unsubstituted C1 to C20 alkyl group, a substituted or unsubstituted C1 to C20 alkoxy group, a substituted or unsubstituted C6 to C30 aryl group, or a substituted or unsubstituted C6 to C30 aryloxy group).

As used herein, the term "sulfonyl group" refers to $SO_2R$ (wherein R is hydrogen, a substituted or unsubstituted C1 to C20 alkyl group, a substituted or unsubstituted C1 to C20 alkoxy group, a substituted or unsubstituted C6 to C30 aryl group, or a substituted or unsubstituted C6 to C30 aryloxy group).

As used herein, the term "sulfoxide group" refers to SOR (wherein R is hydrogen, a substituted or unsubstituted C1 to C20 alkyl group, a substituted or unsubstituted C1 to C20 alkoxy group, a substituted or unsubstituted C6 to C30 aryl group, or a substituted or unsubstituted C6 to C30 aryloxy group).

As used herein, the term "sulfonamide group" refers to $SO_2NRR'$ (wherein R and R' are the same or different and hydrogen atom, a substituted or unsubstituted C1 to C20 alkyl group, a substituted or unsubstituted C1 to C20 alkoxy group, a substituted or unsubstituted C6 to C30 aryl group, or substituted or unsubstituted C6 to C30 aryloxy group).

As used herein, the term "sulfonate group" refers to $SO_3R$ (wherein R is hydrogen, a substituted or unsubstituted C1 to C20 alkyl group, a substituted or unsubstituted C1 to C20 alkoxy group, a substituted or unsubstituted C6 to C30 aryl group, or a substituted or unsubstituted C6 to C30 aryloxy group).

As used herein, when a specific definition is otherwise provided, the term "substituted" refers to one substituted with a substituent selected from a halogen, a C1 to C20 alkyl group, a C1 to C20 haloalkyl group, a C1 to C20 alkoxy group, a C6 to C30 aryl group, or a C6 to C30 aryloxy group.

Hereinafter, an organic light emitting diode device according to one embodiment is described referring to FIG. 1.

FIG. 1 is a schematic cross-sectional view showing an organic light emitting diode device according to one embodiment.

Referring to FIG. 1, the organic light emitting diode device according to one embodiment includes a substrate 100, a first electrode 110 disposed on the substrate, an emission layer 120 disposed on the first electrode, an auxiliary layer 130 disposed on the emission layer, and a second electrode 140 disposed on the auxiliary layer 130.

In some embodiments, the substrate 100 may include a substrate commonly used for an organic light emitting diode device, and in particular, a glass substrate, a plastic substrate, and the like may be used.

In some embodiments, the first electrode 110 may be an anode, which may be a transparent electrode in a bottom emission device, and a reflective electrode in a top emission device.

When the first electrode 110 is a transparent electrode, ITO (indium tin oxide), IZO (indium zinc oxide), TO (tin oxide), or ZnO (zinc oxide) may be used. When the first electrode 110 is a reflective electrode, a laminated reflective layer/transparent electrode may be used as a reflective electrode. The reflective layer includes silver (Ag), magnesium (Mg), aluminum (Al), platinum (Pt), palladium (Pd), gold (Au), nickel (Ni), neodymium (Nd), iridium (Ir), chromium (Cr), or a combination thereof and the transparent electrode includes ITO, IZO, TO or ZnO.

The material for the emission layer 120 is not specifically limited, but it may include a material randomly selected from the known host materials and dopant materials.

Examples of the host material may include 4,4'-N,N'-dicarbazol-biphenyl (CBP), bis(2-methyl-8-quinolinato)-4-phenylphenolate aluminum (BAlq), 2,9-dimethyl-4,7-diphenyl-1,10-phenanthroline (BCP), N,N'-dicarbazolyl-1,4-dimethene-benzene (DCB), rubrene, 9,10-bis(2-naphthyl) antracene (AND), and the like.

In some embodiments, the dopant material may include 4,4'-bis(2,2'-diphenyl vinyl)-1,1'-biphenyl (DPVBi), a distyrylamine derivative, a pyrene derivative, a perylene derivative, a distyrylbiphenyl (DSBP) derivative, a 10-(1,3-benzothiazol-2-yl)-1,1,7,7-tetramethyl-2,3,6,7-tetrahydro-1H,5H,11H-pyrano-(2,3-f)pyrido-(3,2,1-ij)quinoline-11-one (C545T), quinacridone derivative, tris(2-phenylpyridine) iridium (Ir(PPy)), PQIr, Btp$_2$Ir(acac), 4-(dicyanomethylene)-2-tert-butyl-6-(1,1,7,7-tetramethyljulolydyl-9-enyl)-4H-pyran (DCJTB), 4-(dicyanomethylene)-2-methyl-6-(p-dimethylaminostyryl)-4H-pyrane (DCM), 2,3,7,8,12,13,17,18-octaethyl-21H,23H-porphyrin-platinum complex (PtOEP), Ir(piq)2(acac), RD3 (manufactured by Kodak) or the like.

In some embodiments, the organic light emitting diode device may further include at least one of hole injection layer (HIL) and hole transport layer (HTL) between the first electrode 110 and the emission layer 120.

In some embodiments, the hole injection layer (HIL) may be formed according to a vacuum deposit or a solution process. In some embodiments, the hole injection layer (HIL) can be made by vacuum deposit, and the hole injection layer (HIL) material may include at least one of an aryl amine-based compound and a starburst-based compound which facilitates the hole injection.

Examples thereof may include a low molecular material such as CuPc (cupper phthalocyanine), TNATA, TCTA, TDAPB, TDAT, m-MTDATA or the like; or PANI (polyaniline), polyaniline/dodecylbenzenesulfonic acid (Pani/DBSA), poly(3,4-ethylenedioxythiophene)/poly(4-styrenesulfonate) (PEDOT/PSS) or the like, but is not limited thereto.

In some embodiments, the hole transport layer (HTL) can be a layer facilitating the hole transport toward the emission layer. The material thereof is not specifically limited.

In some embodiments, the hole transport layer (HTL) material may include 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-(1,1-biphenyl)-4,4'diamine, N,N'-di(naphthalen-1-yl)-N,N'-diphenyl benzidine (a-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB) or poly(9,9-dioctylfluorene-co-bis(4-butylphenyl-bis-N,N-phenyl-1,4-phenylenediamine (PFB), and the like, but is not limited thereto.

In some embodiments, the hole transport layer (HTL) material may include a low molecular material such as a-NPB (N,N'-bis(naphthalen-1-yl)-N,N'-bis(phenyl)benzidine), TPD (N,N'-bis(3-methylphenyl)-N,N'-bis(phenyl)benzidine), spiro-TAD, MTDATA (4,4',4"-tris(N-3-methylphenyl-N-phenyl-amino)-triphenylamine) or the like; or a polymer material such as PVK (polyvinyl carbazole) or the like.

In some embodiments, the auxiliary layer 130 may be prepared by including substituted or unsubstituted pyrene-based compounds having at least one appended phenyl group.

In some embodiments, the pyrene-based compound may have the following Chemical Formula 1.

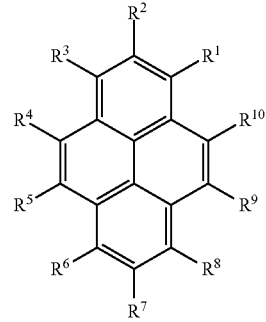

[Chemical Formula 1]

wherein, $R^1$, $R^2$, $R^3$, $R^4$, $R^5$, $R^6$, $R^7$, $R^8$, $R^9$, and $R^{10}$ can each separately be hydrogen, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C30 cycloalkyl group, a substituted or unsubstituted C3 to C30 cycloalkenyl group, a substituted or unsubstituted C3 to C30 cycloalkynyl group, a substituted or unsubstituted C6 to C30 aryl group, a substituted or unsubstituted C6 to C30 aryl amine group, a substituted or unsubstituted C1 to C30 heterocycloalkyl group, a substituted or unsubstituted C1 to C30 heterocycloalkenyl group, a substituted or unsubstituted C1 to C30 heterocycloalkynyl group, a substituted or unsubstituted C3 to C30 heteroaryl group, a substituted or unsubstituted silane group, a substituted or unsubstituted boron atom, an amine group, a nitrile group, a nitro group, a halogen, an amide group, an ester group, a sulfonyl group, a sulfoxide group, a sulfonamide group, a sulfonate group, or a trifluoromethyl group, or one or more of the forgoing groups optionally forms a condensed cyclic group with an adjacent group, and at least one of $R^1$, $R^2$, $R^3$, $R^4$, $R^5$, $R^6$, $R^7$, $R^8$, $R^9$, and $R^{10}$ can be a phenyl group.

In some embodiments, at least one of $R^1$, $R^2$, $R^3$, $R^4$, $R^5$, $R^6$, $R^7$, $R^8$, $R^9$, and $R^{10}$ in above Chemical Formula 1 may be a phenyl group, and simultaneously, at least other one may include benzofuran group, dibenzofuran group, carbazole group, naphthyl group, pyridine group, quinoline group, isoquinoline group, benzimidazole group, phenanthroline group, acridine group, imidazole group, triazole group, bipyridine group, or benzoxazole group.

In some embodiments, the auxiliary layer 130 may be formed by further including an inorganic compound or metal other than the pyrene-based compound.

In some embodiments, the inorganic compound may include a Liq compound represented by the following Chemical Formula 2, LiF, NaF, KF, RbF, CsF, FrF, MgF$_2$, CaF$_2$, SrF$_2$, BaF, LiCl, NaCl, KCl, RbCl, CsCl, FrCl, Li$_2$O, Li$_2$O$_2$, Na$_2$O, K$_2$O, RbO, Rb$_2$O$_2$, Cs$_2$O, Cs$_2$O$_2$, LiAlO$_2$, LiBO$_2$, LiTaO$_3$, LiNbO$_3$, LiWO$_4$, Li$_2$CO, NaWO$_4$, K$_2$SiO$_3$, BO, Al$_2$O$_3$, SiO$_2$, or combination thereof.

In some embodiments, the metal may include lithium (Li), sodium (Na), potassium (K), cesium (Cs), beryllium (Be), magnesium (Mg), calcium (Ca), strontium (Sr), barium (Ba), yttrium (Y), lanthanum (La), cerium (Ce), samarium (Sm), gadolinium (Gd), erbium (Eb), ytterbium (Yb), an Al—Li alloy, an Mg—Sr alloy, an In—Li alloy, or a combination thereof.

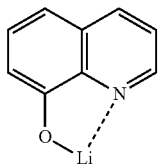

[Chemical Formula 2]

In some embodiments, the pyrene-based compound and the inorganic compound or metal may be mixed in a weight ratio of about 1:100 to about 100:1, for example, a weight ratio of 1:1 to 1:2. The electron mobility is changed according to the ratio of two materials and affects on the recombination of hole and electron in the emission layer, so as to change the charge balance. When they are mixed in the ratio range, the charge balance of hole and electron is the suitable to further improve the luminous efficiency and the life-span characteristic of organic light emitting diode device.

In some embodiments, the auxiliary layer 130 may be formed by mixing the pyrene-based compound and the inorganic compound or metal according to co-deposition.

In some embodiments, the second electrode 140 may be a cathode. In some embodiments, the second electrode 140 can be a front light emitting type, where it may be fabricated by providing a transflective cathode and laminating a transmission cathode. In some embodiments, it may be fabricated by providing a transflective cathode using a metal having a low work function, for example, at least one material of Li, Ca, LiF/Ca, LiF/Al, Al, Mg, and an Mg alloy and additionally laminating a layer using ITO, IZO or the like having a resistance characteristics.

In some embodiments, the auxiliary layer 130 may be at least one of electron transport layer (ETL) and electron injection layer (EIL), for example, an electron transport layer (ETL).

Figure 2:
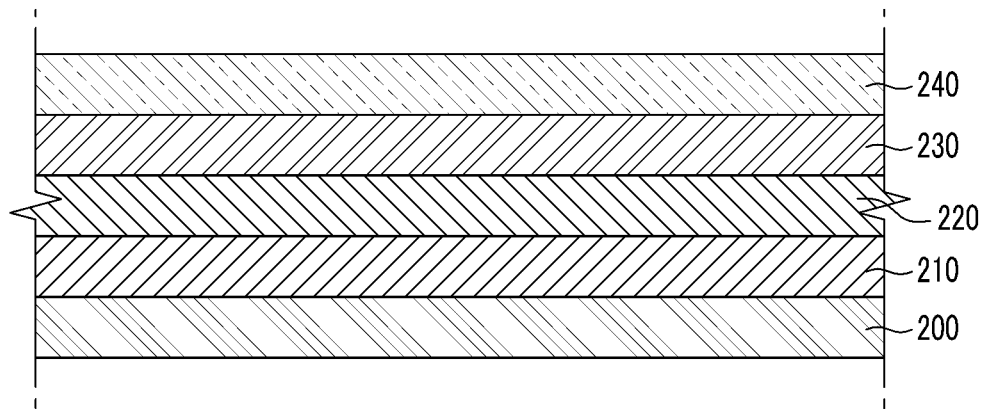
FIG. 2 is the schematic cross-sectional view of an organic light emitting diode device according to another embodiment.

FIG. 2 is the schematic cross-sectional view of an organic light emitting diode device according to another embodiment.

Referring to FIG. 2, the organic light emitting diode device according to another embodiment includes a substrate 200, a first electrode 210 disposed on the substrate, an auxiliary layer 220 disposed on the first electrode 210, an emission layer disposed on the auxiliary layer, and a second electrode 240 disposed on the emission layer.

In some embodiments, the first electrode 210 may be a cathode. In some embodiments, the first electrode 210 can be the front light emitting type, where it can have a structure where the transmission cathode can be laminated after providing the transflective cathode. In some embodiments, it may be formed by providing a transflective cathode using one material of Li, Ca, LiF/Ca, LiF/Al, Al, Mg, and Mg alloy which has a low work function and additionally laminating a layer of ITO, IZO or the like having a low resistance characteristic.

In some embodiments, the auxiliary layer 220 and the emission layer 230 can be the same as described in the auxiliary layer 130 and the emission layer 120 according to one embodiment.

In some embodiments, the second electrode 240 may be an anode. For example, when it is a bottom light emission type, it may be used as a transparent electrode; when it is a front light emission type, it may be used as a reflective electrode.

In some embodiments, the second electrode 240 can be used as a transparent electrode, where it may include ITO (indium tin oxide), IZO (indium zinc oxide), TO (tin oxide), or ZnO (zinc oxide). In some embodiments, the second electrode 240 can be used as a reflective electrode, where the reflective electrode may be formed by providing a reflective layer of silver (Ag), magnesium (Mg), aluminum (Al), platinum (Pt), palladium (Pd), gold (Au), nickel (Ni), neodymium (Nd), iridium (Ir), chromium (Cr), or a combination thereof, and laminating a transparent electrode of ITO, IZO, TO, or ZnO thereon.

In some embodiments, the organic light emitting diode device may further include at least one of a hole injection layer (HIL) and a hole transport layer (HTL) between the second electrode 240 and the emission layer 230.

In some embodiments, hole injection layer (HIL) and the hole transport layer (HTL) can be the same as in above.

The present embodiments are described in more detail according to Examples and Comparative Examples below. The following examples are for illustrative purposes only and are not intended to limit the scope of the one or more embodiments.

Fabricating Organic Light Emitting Diode Device

Example 1

ITO (indium tin oxide) was laminated in a thickness of 1400 Å on a glass substrate and patterned to provide a first electrode and vacuum-deposited with MTDATA (4,4',4"-tris(N-3-methylphenyl-N-phenyl-amino)-triphenylamine) in a thickness of 500 Å to provide a hole injection layer (HIL) and vacuum-deposited with N,N'-di(naphthalen-1-yl)-N,N'-diphenyl benzidine (a-NPD) in a thickness of 200 Å to provide a hole transport layer (HTL). Then a blue emission layer was formed with a host material of 9,10-bis(2-naphthyl)anthracene and a dopant material of EK8 (manufactured by Kodak) in a thickness of 400 Å. A pyrene-based compound represented by the following Chemical Formula 3 and a Liq compound represented by the following Chemical Formula 2 were mixed in a weight ratio of 1:1 weight ratio according to co-deposition to provide an auxiliary layer having a thickness of 400 Å. Then it was vacuum-deposited with Al in a thickness of 1000 Å as a second electrode to provide an organic light emitting diode device.

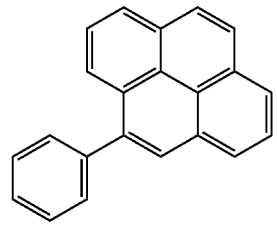

[Chemical Formula 3]

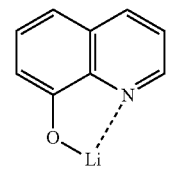

[Chemical Formula 2]

Example 2

An organic light emitting diode device was fabricated in accordance with the same procedure as in Example 1, except that a pyrene-based compound represented by Chemical Formula 3 and a Liq compound represented by Chemical Formula 2 were mixed in a weight ratio of 1:2.

Comparative Example 1

An organic light emitting diode device was fabricated in accordance with the same procedure as in Example 1, except that a pyrene-based compound represented by the following Chemical Formula 5 was used instead of a pyrene-based compound represented by Chemical Formula 3.

[Chemical Formula 5]

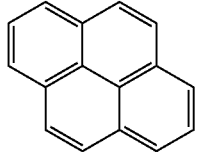

Evaluation 1

The organic light emitting diode devices obtained from Examples 1 and 2 and Comparative Example 1 were measured for the luminous efficiency and the life-span characteristics according to the following methods, and the results are shown in the following Table 1 and FIG. 3.

The luminance was measured using a CRTM 620 device, and the voltage and current were measured using Keithley. Current and luminance was measured by increasing voltage to calculate current density, current efficiency, and electric power efficiency.

The conversion efficiency is obtained by dividing current efficiency by color coordinate Y.

TABLE 1

|  | Driving voltage (V) | Current density (mA/cm2) | Current efficiency (cd/A) | Electric power efficiency (lm/W) | Luminance color coordinate (X) | Luminance color coordinate (Y) | Conversion efficiency (%) |
|---|---|---|---|---|---|---|---|
| Ex. 1 | 3.9 | 10.7 | 3.3 | 2.7 | 0.145 | 0.041 | 81.1 |
| Ex. 2 | 3.8 | 10.0 | 3.7 | 3.1 | 0.144 | 0.044 | 85 |
| Comp. Ex. 1 | 5.0 | 26.0 | 1.3 | 0.8 | 0.148 | 0.038 | 33.3 |

Referring to Table 1, compared to Comparative Example 1 including a pyrene-based compound having no phenyl group, Examples 1 and 2 including an auxiliary layer including a substituted or unsubstituted pyrene-based compound having at least one phenyl group according to one embodiment decreased the driving voltage in 1V or more and remarkably increased the current efficiency and the electric power efficiency and significantly improved the conversion efficiency, so it is confirmed that the luminous efficiency was improved.

In addition, it is confirmed that the luminous efficiency was enhanced in Examples 1 and 2 according to one embodiment that a substituted or unsubstituted pyrene-based compound having at least one phenyl group and an inorganic compound or metal were mixed in a weight ratio of 1:1 to 1:2.

Figure 3:
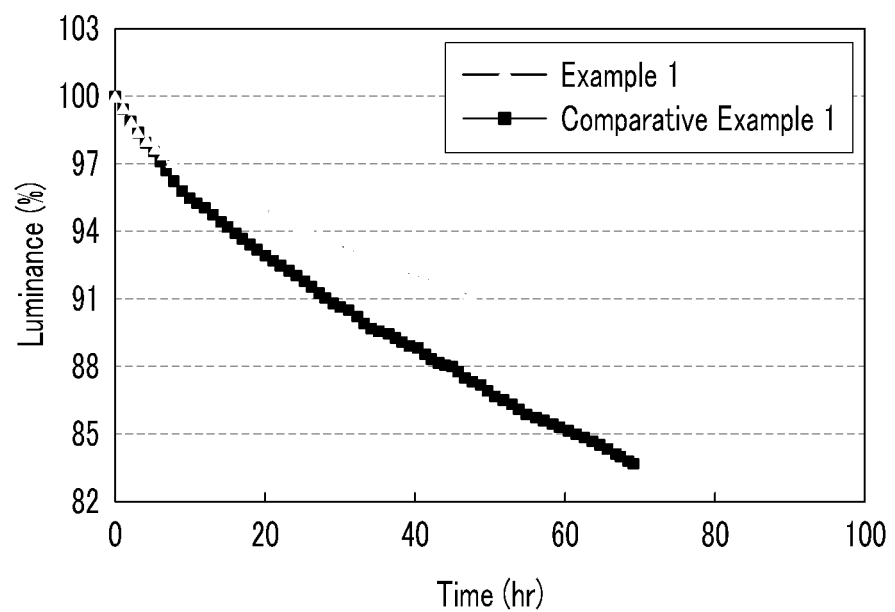
FIG. 3 is the graph of a luminance change of organic light emitting diode devices obtained from Example 1 and Comparative Example 1 according to a lapse of time.

FIG. 3 is a graph of luminance change of the organic light emitting device obtained from Example 1 and Comparative Example 1 depending upon a lapse of time.

Referring to FIG. 3, it is confirmed that the luminance change was decreased in Examples 1 and 2 including an auxiliary layer including a substituted or unsubstituted pyrene-based compound having at least one phenyl group according to one embodiment, compared to Comparative Example 1 including a pyrene-based compound having no phenyl group, thereby, the life-span characteristic was enhanced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF DRAWING SYMBOLS 100, 200: substrate
110, 210: first electrode
120, 230: emission layer
130, 220: auxiliary layer
140, 240: second electrode

What is claimed is:
1. An organic light emitting diode device, comprising
a first electrode;
a second electrode facing the first electrode;
an emission layer interposed between the first electrode and the second electrode; and
an auxiliary layer interposed between either one of the first electrode and the second electrode and the emission layer,
wherein the auxiliary layer is a single layer, and
wherein the auxiliary layer is a mixture of: i) an inorganic compound having the following structure:

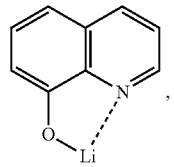

and ii) a compound having the following structure:

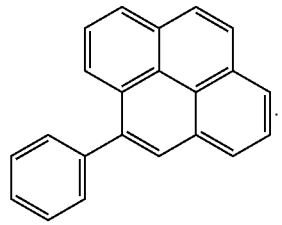 [SMILES: c1ccc(-c2cc3cccc4ccc5cccc2c5c43)cc1]

2. The organic light emitting diode device of claim 1, wherein

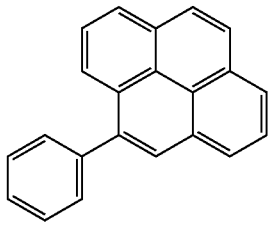 [SMILES: c1ccc(-c2cc3cccc4ccc5cccc2c5c43)cc1]

and the inorganic compound are mixed in a weight ratio of about 1:100 to about 100:1.

3. The organic light emitting diode device of claim 1, wherein

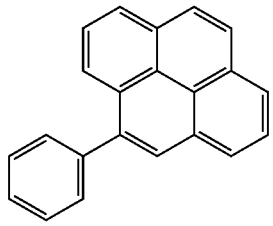 [SMILES: c1ccc(-c2cc3cccc4ccc5cccc2c5c43)cc1]

and the inorganic compound are mixed in a weight ratio of 1:1 to 1:2.

4. The organic light emitting diode device of claim 1, wherein the auxiliary layer comprises an electron transport layer (ETL).

* * * * *